United States Patent

Kemp

Patent Number: 5,252,826
Date of Patent: Oct. 12, 1993

[54] DIFFERENTIAL PRESSURE UTILIZING OPTO-REFLECTIVE SENSOR

[75] Inventor: Stephen J. Kemp, St. Paul, Minn.

[73] Assignee: Honeywell Inc., Minneapolis, Minn.

[21] Appl. No.: 816,016

[22] Filed: Dec. 30, 1991

[51] Int. Cl.$^5$ .............................................. G01D 5/34
[52] U.S. Cl. ............................... 250/231.19; 73/705
[58] Field of Search .................. 250/231.19, 231.10, 250/229; 73/705, 715, 723

[56] References Cited

U.S. PATENT DOCUMENTS

| | | |
|---|---|---|
| 3,159,750 | 12/1964 | Kazan . |
| 3,191,440 | 6/1965 | Miller . |
| 3,503,116 | 3/1970 | Strack .................. 73/705 |
| 3,946,716 | 3/1976 | Pikul . |
| 4,122,337 | 10/1978 | Okuda et al. . |
| 4,283,114 | 8/1981 | Wandrack . |
| 4,289,963 | 9/1981 | Everett . |
| 4,321,831 | 3/1982 | Tomlinson et al. . |
| 4,342,230 | 8/1982 | Okamura et al. . |
| 4,358,960 | 11/1982 | Porter .................. 73/705 |
| 4,360,247 | 11/1982 | Beasley . |
| 4,466,295 | 8/1984 | Wesson . |
| 4,476,880 | 10/1984 | Giem et al. . |
| 4,501,293 | 2/1985 | Furlong et al. . |
| 4,502,334 | 3/1985 | Gorgens et al. . |
| 4,515,473 | 5/1985 | Mermelstein . |
| 4,531,414 | 7/1985 | Kraus . |
| 4,543,831 | 10/1985 | Meyer .................. 250/231.19 |
| 4,546,793 | 10/1985 | Stupecky . |
| 4,687,927 | 8/1987 | Iwamoto et al. .............. 250/231.19 |
| 4,745,925 | 5/1988 | Dietz . |
| 4,771,640 | 9/1988 | Matsuura . |
| 5,127,269 | 7/1992 | Grudrien .................. 250/231.19 |
| 5,128,537 | 7/1992 | Halg .................. 250/231.19 |

OTHER PUBLICATIONS

Honeywell Brochure, "C6065A Differential Pressure Switch", Publication date unknown.
OMRON Brochure, "Photomicrosensors", Publication date unknown.

*Primary Examiner*—David C. Nelms
*Attorney, Agent, or Firm*—Ian D. MacKinnon

[57] ABSTRACT

A differential pressure sensor utilizing an opto-reflective sensor comprising a diaphragm with a top and a bottom, the diaphragm having an optical reflector mounted upon it. The diaphragm is mounted in a housing, wherein the housing has a first inlet port and a second inlet port, the first inlet port providing a first pressure to the top of the diaphragm and the second inlet port providing a second pressure to the bottom of the diaphragm. An opto-reflective sensor is mounted in the housing, wherein the opto-reflective sensor provides an optical signal to the optical reflector. The optical reflector reflects the signal back to the opto-reflective sensor, wherein the differential pressure sensor calculates the distance of the optical reflector from the opto-reflective sensor in relation to the relative intensity of the reflected optical signal. The differential pressure sensor then calculates the differential pressure between the first pressure and the second pressure based on the relative intensity of the reflected optical signal.

20 Claims, 5 Drawing Sheets

DIFFERENTIAL PRESSURE UTILIZING OPTO-REFLECTIVE SENSOR

BACKGROUND OF THE INVENTION

The present invention pertains low pressure airflow sensors. More particularly, it pertains to a sensor which can determine low pressure differentials.

Pressure sensors are utilized most commonly as pressure switches, turning on, as an example, electronic air cleaners when a pressure differential is determined. The switch compares the pressure downstream of the air cleaner to the pressure of the air surrounding the air cleaner. Usually, there is a return duct between the air cleaner and a grill to ambient air. When a return duct is present the pressure differential the airflow swtich senses is the pressure differential between the pressure following the air filter and the ambient air pressure.

An example of a prior art pressure swtich is U.S. Pat. No. 4,122,337, issued to Okuda et al. The pressure switch illustrated in Okuda et al. is a pressure electrical signal conversion means comprising a diaphragm assembly which is moved in accordance with the difference of pressure between the two compartment therein. Illumination means directs light in a band onto a photosensitive unit which includes two elements so disposed that when any particular band of the photo-sensitive area is illuminated, the illuminated area of one element is greater than that of the other. The photo-sensitive element produces an output proportional to the relative size of the illuminated areas of the elements. The photo-sensitive unit of an illumination means being moveable relative to one another in proportion to the movement of the diaphragm. Examples illustrate mounting a plate onto a diaphragm and preventing light from reaching a sensor through a shield until a specified pressure is reached. A second method shown illustrates attaching the sensor itself to the diaphragm, and determining the position of the diaphragm relative to where the light is reflected on the sensor. This method is useful, however, it is only useful for determining whether or not a set pressure has been achieved and cannot be utilized for determining what the pressure is.

A second application of a pressure sensor is in commercial building environmental control. This application differs from a pressure switch, as it can provide pressure indications over a continuous range. Most heating and cooling units divide the building into zones for heating and cooling. The zones will have pressure differentials between them which the heating and cooling unit must be able to sense. Pressure sensors can be utilized for this purpose.

SUMMARY OF THE INVENTION

In accordance with the principles of the invention an air pressure sensor is achieved which measures air pressure based upon the intensity of reflected light. The air pressure sensor is capable of sensing pressure differential at least as low as 0.020 inch WC (Water Column). The pressure sensor comprises a diaphragm, a housing with input ports, and an opto-reflective sensor. The diaphragm is mounted in the housing such that the first port and the second port provide differential pressures to either surface. For example one port may provide an ambient pressure and the second port will be utilized to provide the pressure to be measured. In this manner the diaphragm is forced toward the lesser of the two pressures. An optical reflector is mounted onto the diaphragm. The opto-reflective sensor is mounted opposite the optical reflector such that the opto-reflective sensor transmits an optical signal to the optical reflector, the optical reflector reflects the signal back to the opto-reflective sensor. The intensity of the reflected signal is depended upon the distance the optical reflector is from the opto-reflective sensor. Based on the intensity of the reflected signal it is then possible to calculate the differential pressure.

A compensation means is further disclosed in copending and commonly owned application entitled, "Compensation Mechanism for a Pressure Sensor", Ser. No. 816,026, filed on the same date and is hereby incorporated by reference.

DESCRIPTION OF THE PREFERRED EMBODIMENT

Airflow switch 1 provides low voltage, on/off control based on negative relative pressure. This embodiment is utilized to control the output of a high voltage switching power supply in an electronic air cleaner. In the electronic air cleaner, airflow switch 1 senses negative pressure in the duct relative to the surrounding air. This occurs when there is airflow in the duct and the pressure drop occurs across the electronic air cleaner pre-filter. When a preset pressure is reached, the electronic air cleaner power supply is activated and power is supplied to the electronic air cleaner cells.

Figure 1:
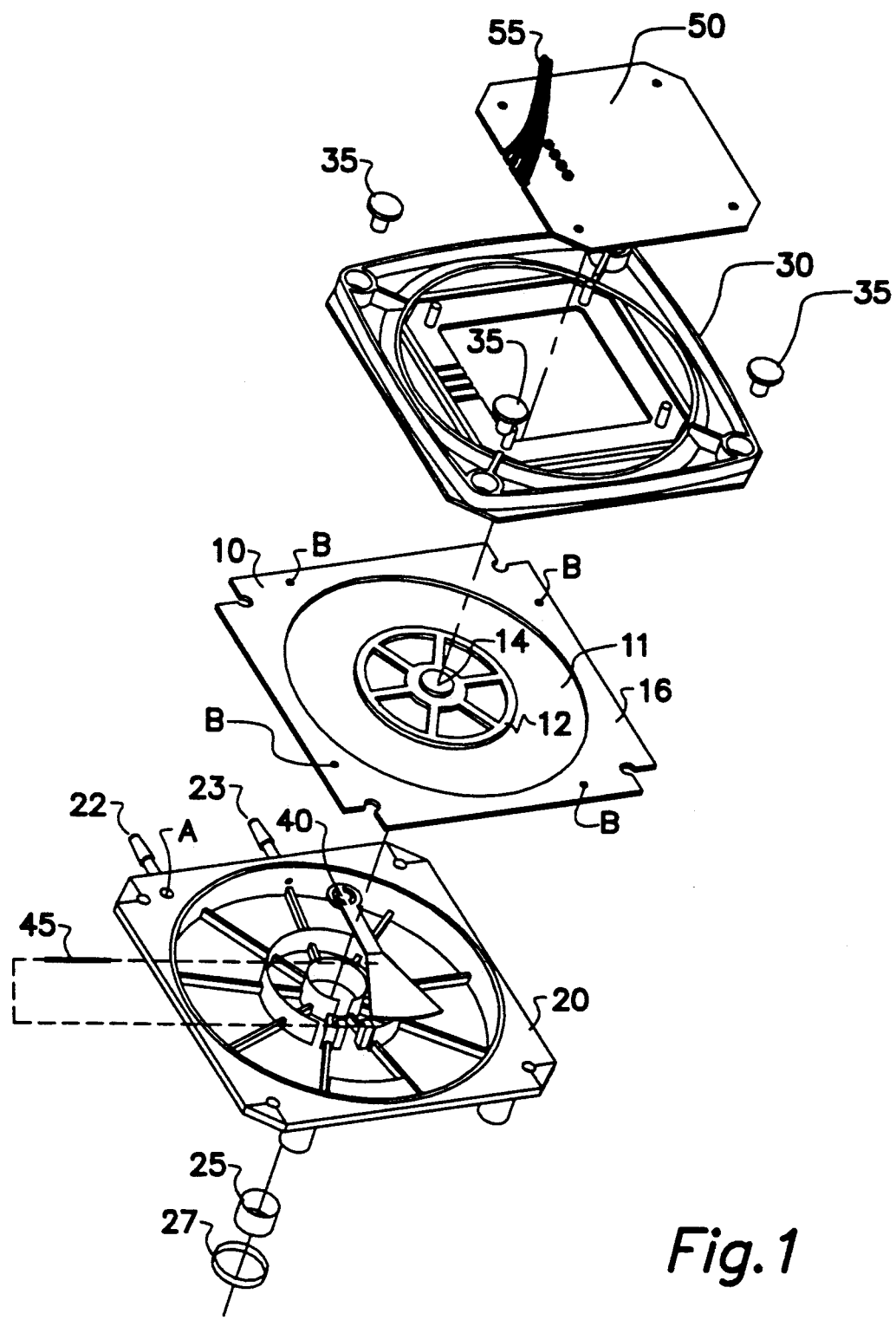
FIG. 1 illustrates the preferred embodiment for an airflow switch.

Airflow switch 1 of FIG. 1 comprises diaphragm assembly 10 which is sealed between two housings, base 20 and cover 30. Base 20 contains counterweight or rocker arm 40 which is held in place by pivot rod 45. Base 20 further contains a control spring 25 and adjustment screw 27. Cover 30 supports printed wiring board 50, which also houses opto-reflective sensing component 60 (not shown). Printed wiring board 50 communicates with an external control means through leads 55. Housings 30 and 20 are fastened together utilizing eyelets 35.

Base 20 further has differential air ports 22 and 23. Port 22 is a high pressure port and provides a reference pressure which is applied to the top portion of diaphragm assembly 10, the top being the portion near cover 30. The reference pressure is the ambient pressure. Port 22 provides the ambient pressure to the top portion of diaphragm assembly 10 by first passing internally through opening A in base 20. The air is allowed to pass through gasket 16 of diaphragm assembly 10 by means of hole B. The air then passes through a slot (not shown) in cover 30. The slot allows the air to pass into the cavity on the high pressure side of diaphragm assembly 10.

Port 23 is a low pressure port and provides the sensed pressure to diaphragm 10. The sensed pressure is a negative pressure with respect to the reference pressure, and is applied to the bottom of diaphragm 10, the bottom of diaphragm assembly being nearer base 20.

In the present embodiment, printed wiring board 50 is not well sealed to cover 30. This is acceptable for this embodiments the high pressure side of diaphragm assembly 10 is connected to the ambient pressure. If the switch were to be used as a true differential switch, a seal would be needed between printed wiring board 50 and cover 30.

Figure 2:
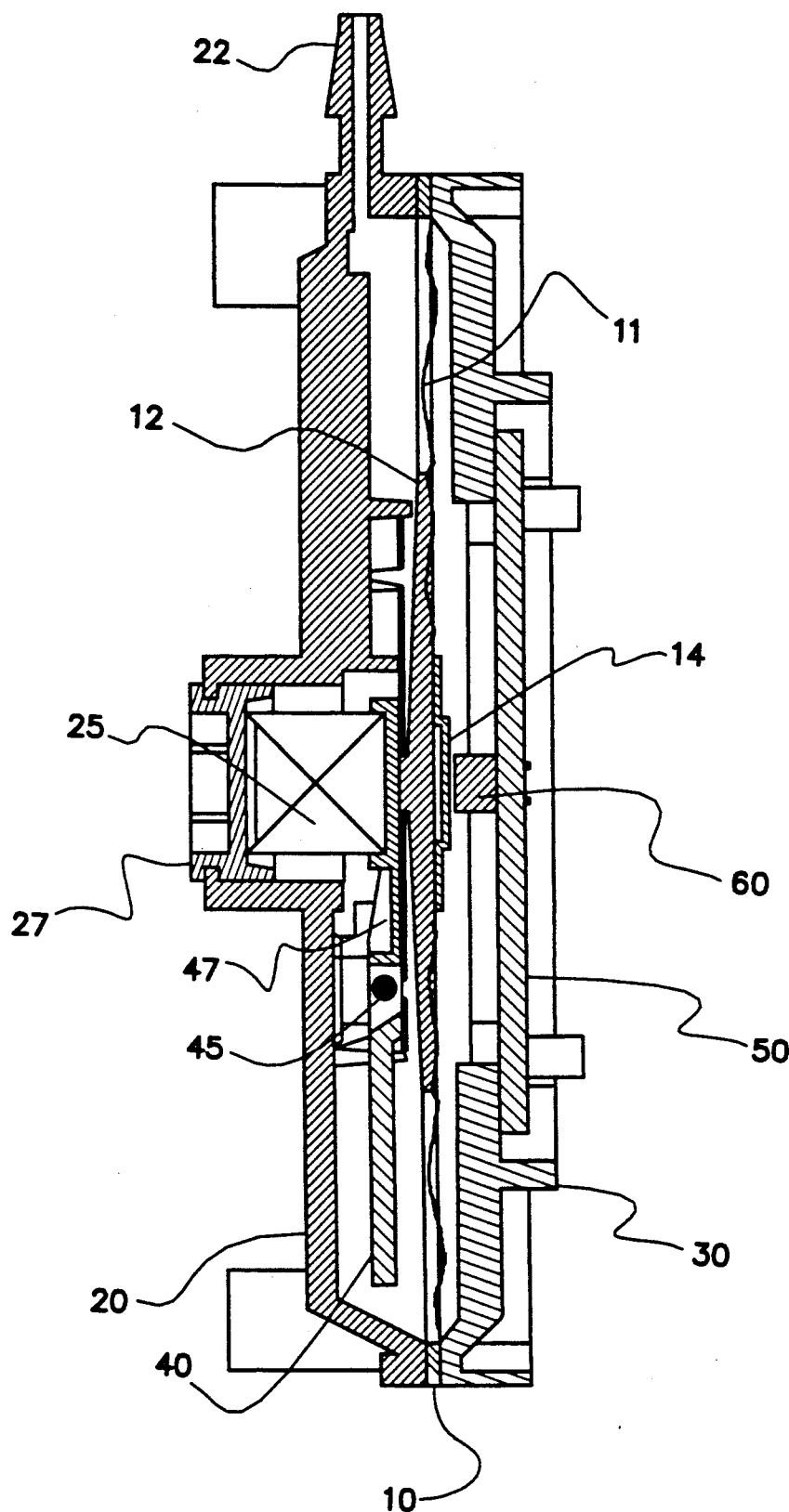
FIG. 2 illustrates the assembled preferred embodiment illustrated in FIG. 1.
Figure 4:
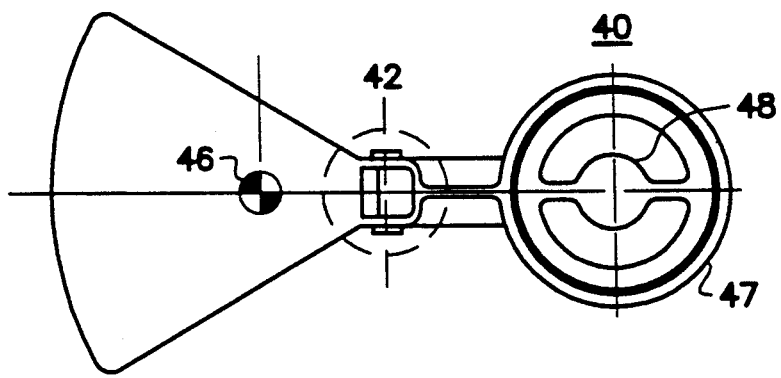
FIG. 4 illustrates the control arm.

FIG. 2 illustrates the assembled airflow switch. Opto-reflective sensor 60 is positioned on printed wiring 50 such that it is centered on reflector plate 14. Inner arm 47 of counterweight mechanism 40 has inner arm center 48 (as shown in FIG. 4) centered on the center of plate support 12. Inner arm 47 also is in contact and retains spring 25. Counterweight mechanism 40 pivots about rod 45. In this manner, the combination of center of gravity 46, spring 25 and the weight of plate support 12 and plate 14 enables the airflow sensor to be mounted in any position without regard to orientation. As counterweight mechanism 40 provides a counterweight against spring 25 and the opposing weight of plate 14 and plate support 12.

Figure 3:
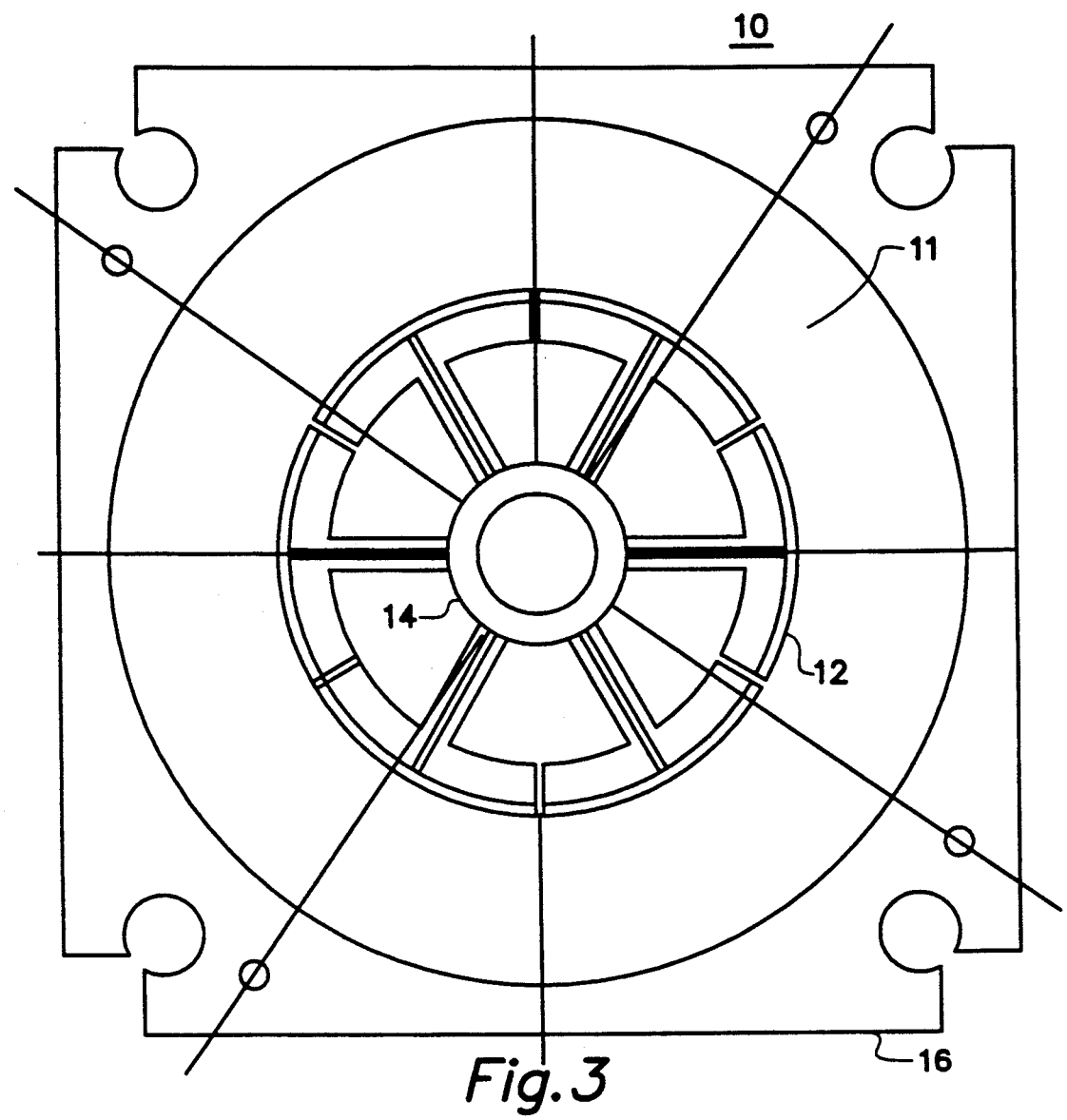
FIG. 3 illustrates the diaphragm for the pressure sensor.

FIG. 3 illustrates diaphragm assembly 10 of FIGS. 1 and 2. Diaphragm assembly 10 is a 0.0002 inches thin polycarbonate diaphragm 11 which utilizes plate support 12 in the center to increase the "effective area" of diaphragm assembly 10. The use of a support plate is common to this type of pressure sensor. The effective area of the diaphragm can be thought of as the ratio of force generated at plate 14 to the pressure differential applied. For a diaphragm without a support plate, the effective area is approximately equal to the area of a circle with a radius equal to half of the total diaphragm radius. If a support plate is used, the approximate effective area would be equal to the area of a circle with a radius equal to the average of the radius of the support plate and the total diaphragm radius.

Polycarbonate diaphragm 11 is mounted on a gasket 16 in order that it may be sealed between base 20 and cover 30. Gasket 16 is urethane foam with a layer of polyester film adhered to it to give it rigidity. Polycarbonate diaphragm 11 is mounted to gasket 16 with an adhesive. Polycarbonate diaphragm 11 is mounted to gasket 16 with a "pucker" or "bagginess". This looseness of polycarbonate diaphragm 11 is critical to the free movement of plate 14 and support plate 12. To do this, polycarbonate diaphragm 11 is not stretched, it is gathered with small folds around its perimeter as it is sealed.

Reflector plate 14 is an optical reflector and is made up of a white nylon reflector made of Dupont Zytel 101 with 8 lb./100 lb. of white colorant. Reflector plate 14 is utilized to reflect the output signal from opto-reflective sensor 60. Reflector plate 14 is ultrasonically bonded to plate support 12 with polycarbonate diaphragm 11 between them.

FIG. 4 illustrates counterweight mechanism 40. Counterweight mechanism 40 has a pivot point located about axis 42 which rod 45 is inserted there through The center of gravity 46 is located on the outer arm of counterweight mechanism 40. Counterweight mechanism 40 is made of Teflon filled acetal (Dupont Derlin 500 AF) to minimize friction at the pivot point. The weight of counterweight mechanism 40 and the distance from axis 4 to center of gravity 46 is tuned to exactly counter the combined weights of plate support 12 and plate 14 at the inner arm center 48.

The function of the switch is to sense low pressure with respect to the pressure immediately surrounding the switch. The airflow switch is constructed with coil spring 25 and counterweight mechanism 40 so that its setpoint does not change with physical orientation of the pressure sensor. Counterweight 40 and control spring 25 hold the diaphragm against opto-reflective sensor 60. Adjustment screw 27 is used to adjust spring 25 pressure during calibration of airflow switch 1. Spring 25 has a low spring rate (8 grams/in.). The low spring pressure is utilized so that diaphragm assembly 10 moves significant distances with small increases in pressure. For the present embodiment, once the force holding diaphragm assembly 10 to opto-reflective sensor 60 is overcome, diaphragm assembly 10 moves quickly away with an increasing pressure differential. To utilize the switch as a pressure sensor to calculate the actual pressure differential, the spring rate would need to be increased.

When there is no pressure, thin polycarbonate film diaphragm 10 with molded plastic support plates 12 is held against opto-reflective sensor 60. As negative pressure is applied, diaphragm 10 pulls away from opto-reflective sensor 60. Opto-reflective sensor 60 has a characteristic of receiving more reflective input as diaphragm 10 moves away from it until a peak is reached at approximately 0.8 mm. When the reflective input to opto-reflective sensor 60 reaches a set level, airflow switch 1 engages the electronic air cleaner.

Figure 7:
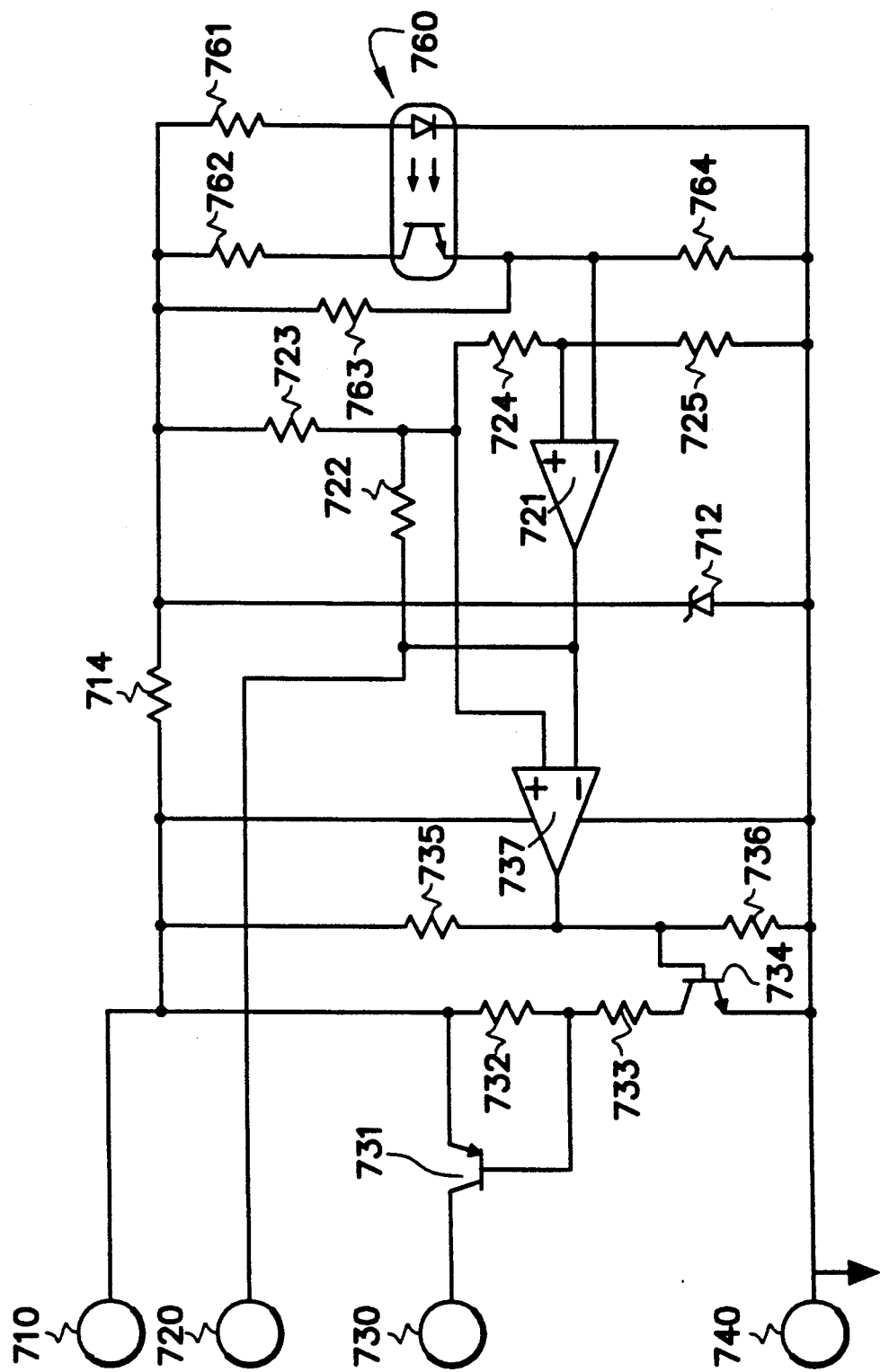
FIG. 7 illustrates a simplified circuit utilized for an airflow sensor switch.

The switch circuit has two outputs. FIG. 7 is the schematic diagram for the switch circuit. First output 720 is grounded when the preset pressure is reached. This output is connected to the "shutdown" pin of the power supply control IC. Second output 730 supplies a voltage equal to the input voltage when the preset pressure is reached. This output is used to operate the performance-indicated driver board of the power supply. Node 710 provides a 5-volt source to the circuit. Node 740 is the system ground. Opto-reflective sensor 760 is electrically connected to resistors 761,762,763 and 764. The sensor provides an output proportional to the distance of plate 14. The operation is further described in the specification relating to FIG. 5. Resistors 763 and 764 provide a level to comparator 721 when no signal is provided by opto-reflective sensor 760. Comparator 721 is provided a voltage level through resistor 723,724 and 725. Zener diode 712 holes the supply voltage constant. Comparator 737 receives the output of comparator 721, comparator 721 being at ground when a level is achieved and at a 5-volt output when a set level is not achieved. Comparator 737 provides an output to transistor 734 which is normally at a reference voltage which is set by resistors 735 and 736. Resistors 732 and 733 provide a voltage level to transistor 731 which is turned on when comparator 737 is high.

Figure 5:
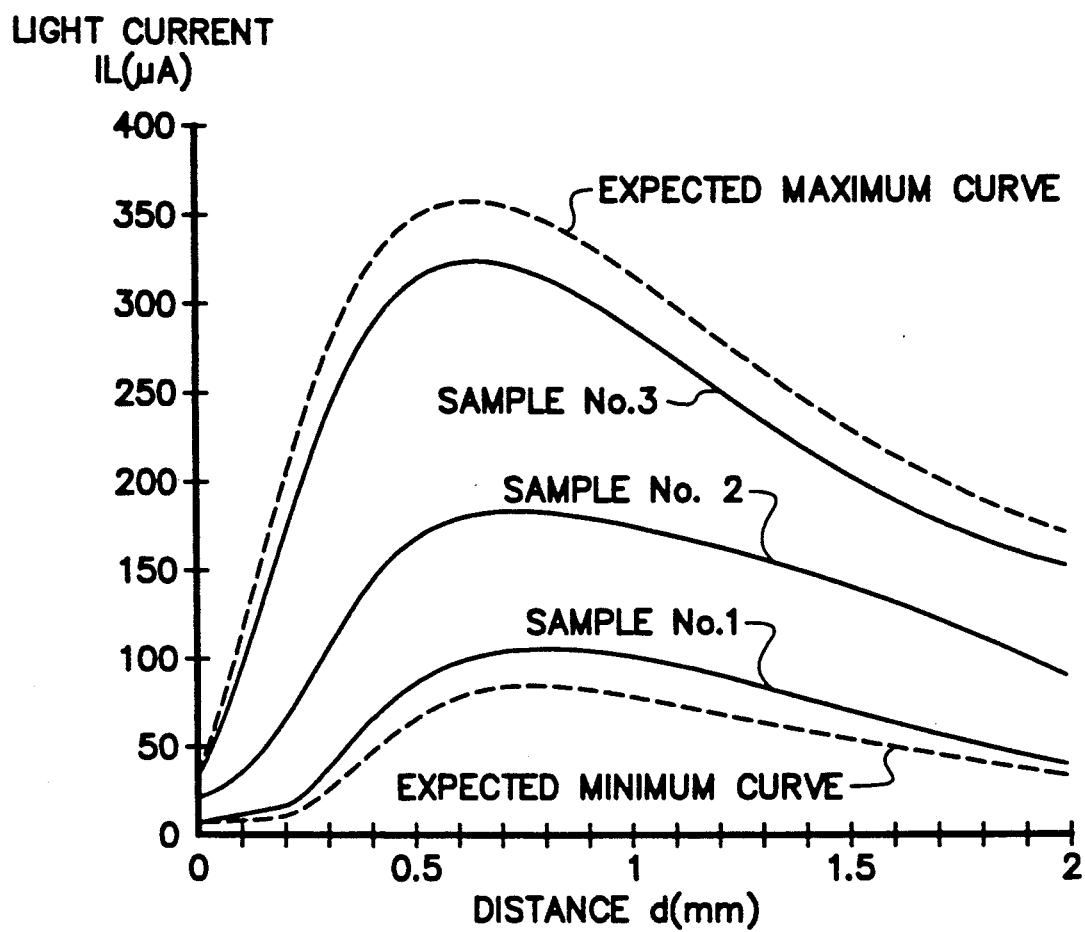
FIG. 5 illustrates light current versus distance response of an opto-reflective sensor on plate 14.
Figures 6A, 6B:
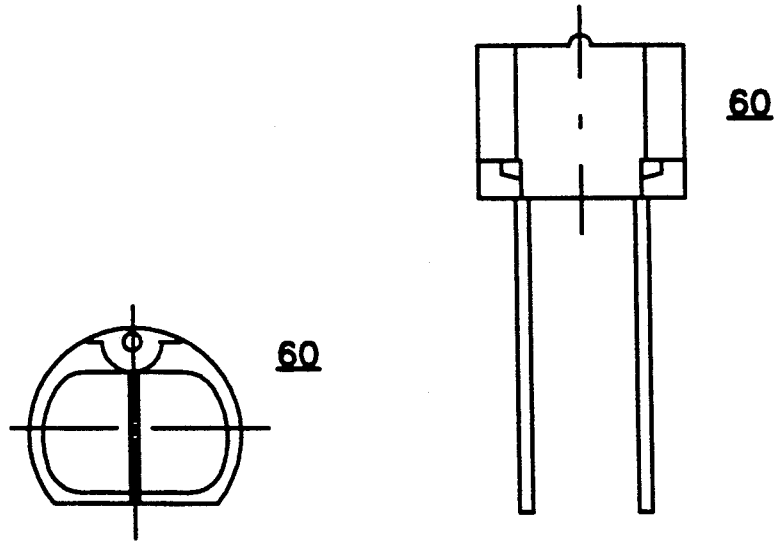
FIGS. 6a and 6b illustrate the opto-reflective sensor.

FIG. 5 illustrates the light current in micro amps versus the distance plate 14 is from the face of opto-reflective sensor 60. As can be seen from FIG. 5, the output of opto-reflective sensor 60 is essentially linear until a distance of 0.8 mm is reached. At that point, the output begins to decrease the greater the distance plate 14 is from opto-reflective sensor 60. The curves of FIG. 5 illustrate the expected maximum curve, the expected minimum curve and three samples which were tested from an Omron supplier of an opto-reflective sensor. The opto-reflective sensor tested was a photo-microprocessor, Part Number EESY101-R12. This part can be obtained from Omron Tateisi Electronics Company of Japan. Opto-reflective sensor 60 is illustrated in FIGS. 6a and 6b. Opto-reflective sensor 60 is also available from Sharp, which is located in Mahwah, N.J., the part number is GP2S22A. As seen in FIG. 4, there is a large variation in the light current for a particular distance for the opto-reflective sensors. Therefore, prior to utilizing an opto-reflective sensor in this device, the opto-reflective sensor must be selected or screened to select opto-reflective sensors which are closer to the expected maximum curve for the light current versus distance graph. This is due to the use which most opto-reflective sensors are utilized for. Most opto-reflective sensors are utilized for the purpose of determining if something has passed by the opto-reflective sensor and not for determining if something has increased or decreased in distance from the opto-reflective sensor. However, by utilizing higher quality opto-reflective sensors, it is possible to not only determine when to switch on an air cleaner, but utilizing a microprocessor it is possible to determine the pressure differential the pressure sensor detects. Such a device may be utilized for determining pressure differentials in zones in a building for building control devices.

I claim:

1. A differential pressure sensor comprising:
a diaphragm with a top and a bottom, said diaphragm having an optical reflector mounted on said diaphragm;
a housing containing said diaphragm, said housing having first and second inlet ports, said first inlet port providing a first pressure to said bottom of said diaphragm, said second inlet port providing a second pressure to said top of said diaphragm; and
an opto-reflective sensor, said opto-reflective sensor providing an optical signal to said optical reflector, said optical reflector reflecting said optical signal back to said opto-reflective sensor, a relative intensity of said reflected optical signal being dependent upon a distance of said optical reflector from said opto-reflective sensor, whereby said diaphragm moves toward a lesser of said first pressure and said second pressure, thereby increasing or decreasing said distance, said differential pressure determining a differential of said first and said second pressure from said relative intensity.

2. The differential pressure sensor of claim 1 wherein said opto-reflective sensor comprises a photo-microprocessor.

3. The differential pressure sensor of claim 1 wherein said optical reflector is a white nylon reflector.

4. The differential pressure sensor of claim 2 wherein said optical reflector is a white nylon reflector.

5. An airflow switch comprising:
a diaphragm with a top and a bottom, said diaphragm having an optical reflector mounted on said diaphragm;
a housing containing said diaphragm, said housing having a first and a second inlet port, said first inlet port providing a first pressure to said bottom of said diaphragm, said second inlet port providing a second pressure to said top of said diaphragm; and
an opto-reflective sensor, said opto-reflective sensor providing an optical signal to said optical reflector, said optical reflector reflecting said optical signal back to said opto-reflective sensor, a relative intensity of said reflected optical signal being dependent upon a distance between said optical reflector and said opto-reflective sensor, whereby said diaphragm moves toward a lesser of said first pressure and said second pressure, and said diaphragm moves a first pre-determined distance, said optical reflector will be a second pre-determined distance from said opto-reflective sensor, wherein when said reflected signal is a pre-determined intensity, said airflow switch will provide a switch signal.

6. The airflow switch of claim 5 wherein said opto-reflective sensor comprises a photo-microprocessor.

7. The air flow of claim 5 wherein said optical reflector is a white nylon reflector.

8. The air flow switch of claim 5 wherein said first pressure is a pressure in a return air duct and said second pressure is ambient air pressure, whereby said airflow switch turns on an electronic air cleaner when a sufficient differential air pressure exists.

9. The air flow switch of claim 8 wherein said optical reflective sensor comprises a photo-microprocessor.

10. The air flow switch of claim 9 wherein said optical reflector is a white nylon reflector.

11. The air flow switch of claim 6 wherein said optical reflector is a white nylon reflector.

12. A differential pressure sensor comprising:
a diaphragm having an optical reflector mounted on said diaphragm;
a housing containing said diaphragm; and
an opto-reflective sensor, said opto-reflective sensor providing an optical signal to said optical reflector, said optical reflector reflecting said optical signal back to said opto-reflective sensor, a relative intensity of said reflected optical signal being dependent upon a distance of said optical reflector from said opto-reflective sensor, whereby differential pressure is determined from said relative intensity.

13. The differential pressure sensor of claim 12 wherein said opto-reflective sensor comprises a photo-microprocessor.

14. The differential pressure sensor of claim 12 wherein said optical reflector is a white nylon reflector.

15. An airflow switch comprising:
a diaphragm having an optical reflector mounted on said diaphragm;
a housing containing said diaphragm; and
an opto-reflective sensor, said opto-reflective sensor providing an optical signal to said optical reflector, said optical reflector reflecting said optical signal back to said opto-reflective sensor, a relative intensity of said reflected optical signal being dependent upon a distance between said optical reflector and said opto-reflective sensor, wherein when said reflected siganl is a pre-determined intensity, said airflow switch will provide a switch signal.

16. The air flow switch of claim 15 wherein said opto-reflective sensor comprises a photo-microprocessor.

17. The air flow switch of claim 15 wherein said optical reflector is a white nylon reflector.

18. The air flow switch of claim 15 wherein said first pressure is a pressure in a return air duct and said second pressure is ambient air pressure, whereby said airflow switch turns on an electronic air cleaner when a sufficient differential air pressure exists.

19. The airflow switch of claim 18 wherein said optical reflective sensor comprises a photo-microprocessor.

20. The air flow switch of claim 19 wherein said optical reflector is a white nylon reflector.

* * * * *